United States Patent [19]  [11] 4,372,475
Goforth et al.  [45] Feb. 8, 1983

[54] ELECTRONIC ASSEMBLY PROCESS AND APPARATUS

[76] Inventors: Melvin L. Goforth, 7619 Hermosa, Amarillo, Tex. 79108; Richard G. Russell, 6607 Roxton, Amarillo, Tex. 79109

[21] Appl. No.: 258,586

[22] Filed: Apr. 29, 1981

[51] Int. Cl.³ .............................................. H05K 3/34
[52] U.S. Cl. .............................. 228/170; 228/180 R; 228/212; 53/140; 361/402
[58] Field of Search ................. 228/180 R, 212, 215, 228/170; 53/140; 361/400, 402

[56] References Cited

U.S. PATENT DOCUMENTS

| 2,687,363 | 8/1954 | Manning | 53/140 X |
| 3,388,465 | 3/1965 | Johnston | 228/212 X |
| 3,610,811 | 10/1971 | O'Keefe | 228/215 X |
| 4,283,480 | 8/1981 | Davies et al. | 228/180 R X |

OTHER PUBLICATIONS

*IBM Technical Disclosure Bulletin*, vol. 16, No. 6, Nov. 1973, p. 1749.

Primary Examiner—Kenneth J. Ramsey
Attorney, Agent, or Firm—Ely Silverman

[57] ABSTRACT

A system of composition, apparatuses and process provides for a rapid and reliable development and location of a web fabric structure to position and hold each member of a closely spaced assembly of positioned but not electrically connected units comprising discrete electrical components and integrated circuits in place on a printed circuit board with the external leads or connectors of such units projecting through holes in such circuit board so that such units are held to the circuit board during soldering of those leads to the conductive portions of the printed circuit board and other manipulations. The fabric structure and a coacting masking agent are of such chemical composition that they are readily completely removed from the circuit board and from the units after need for such fabric and masking agent has passed.

9 Claims, 26 Drawing Figures 40　67　68　69　66　42　50

10A 40 35 33 150 (157, 156 labels on top)

ELECTRONIC ASSEMBLY PROCESS AND APPARATUS

BACKGROUND OF THE INVENTION

1. The Field of the Invention

The field of invention herein is the assembly of electrical apparatuses.

2. Description of the Prior Art

The reliability of multicomponent electronic circuits on circuit boards depend to a large extent on the adequacy of connections between such components and the conductive patterns by which such components are connected to other components in such circuits. However not only is initial location of discrete electrical components in the usually closely packed circuit board time and attention consuming, but also conventional manipulation used in process for multiple concurrent soldering of located component leads provide mechanical agitation which inhibits formation of reliable connections of discrete component external leads to conductive patterns on circuit boards; further, external leads of conventional discrete components are conventionally made with lengths in excess of those necessary in the usual final assembly of such components and removal of such undesirable lengths tend to disrupt and/or displace soldered circuit connections theretofore made. Such factors are largely unpredictable, and uncontrollable and frustrating to production and design personnel but have not been met by devices presently available for holding each of a number of separate components during soldering.

SUMMARY OF THE INVENTION

A system of composition apparatus and process provides for a rapid and reliable development and location of a web fabric structure to position and hold each of a closely spaced assembly of located but not electrically connected discrete electrical components and integrated circuits in place on a printed circuit board with the external leads or connectors of such components projecting through holes in such circuit board whereby each of such units is securely held to the circuit board during soldering of those leads or connectors to the conductive portions of the printed circuit board and other manipulation.

Also, prior to the soldering operation, removable masking agent is applied to selected portions of the circuit board to avoid attachment of solder thereto during the foregoing operation. The fabric structure and masking agent are of such chemical composition and physical structure that they are readily and completely removed from the circuit board and from the electrical units therein after such soldering is completed without chemical, mechanical or electrical interference with the electrical components on the circuit board, the board, or the conductive patterns on such board.

BRIEF DESCRIPTION OF THE DRAWINGS

FIGS. 5, 7, 9 and 11 also diagrammatically show steps in the sequence of another second embodiment of process of operation according to this invention, said second embodiment including the step diagrammatically illustrated in FIG. 15.

FIG. 3 diagrammatically illustrates a first stage in the operation of a process according to this invention in which stage a solution of fabric forming material is applied to a positioned array of components on a printed circuit board. The container for the solution applied is shown broken away in part to illustrate the contents in its interior.

FIG. 5 diagrammatically illustrates a second stage in the operation of process according to this invention in which stage a component holding and positioning fabric is attached to a positioned array of electrical components on a printed circuit board.

FIG. 7 diagrammatically illustrates a third stage in the operation of a process according to this invention in which stage an array of external leads of electrical components held by a fabric network to one surface of a printed circuit board are soldered to portions of the patterns of conductive elements on the surfaces of that printed circuit board.

FIG. 9 diagrammatically illustrates a fourth stage in the operation of a process according to this invention in which stage the assembly of tie down and positioning fabric network and electrically connected components and printed circuit board is located in a body of fluid to dissolve said tie down and positioning fabric network.

FIG. 11 diagrammatically illustrates a fifth stage in the operation of a process according to this invention in which stage the connected assembly of electric components and circuit board free of the network fabric is removed from the body of tie down fabric dissolving fluid.

FIGS. 5, 7, 9 and 11 diagrammatically show the subsequent sequential steps in that sequence of second embodiment of process of operation according to this invention.

FIG. 21 shows a circuit board in its condition as shown in FIG. 3 but shown at a larger scale and is limited to a zone as 21A of FIG. 3.

FIG. 23 diagrammatically illustrates a stage in operation according to this invention as used in conjunction with the tie down fabric forming operation above described in which stage of operation a fabric as 50 (or 150) is applied to the top surface of the array 30 of the circuit board 40.

FIG. 24 diagrammatically illustrates a subsequent stage in the operation of the masking process according to this invention as used in conjunction with the tie down fabric forming operation above described and shown in FIGS. 1–20 in which stage of operation a masking agent is applied to selected portions of the patterns 60 and 66.

FIG. 25 shows a stage in operation wherein solder is applied to the portions of the conductive patterns of the circuit board except for where such patterns are are blocked by the masking agent.

FIG. 26 shows a stage in operation of use of the masking agent wherein, as shown in FIG. 9, the assembly has, following a immersion in a solvent as 82 been removed from that body of fluid with the masking agent as well as the network fabric removed from that assembly of circuit board and electrical components.

DESCRIPTION OF THE PREFERRED EMBODIMENTS

Figure 1:
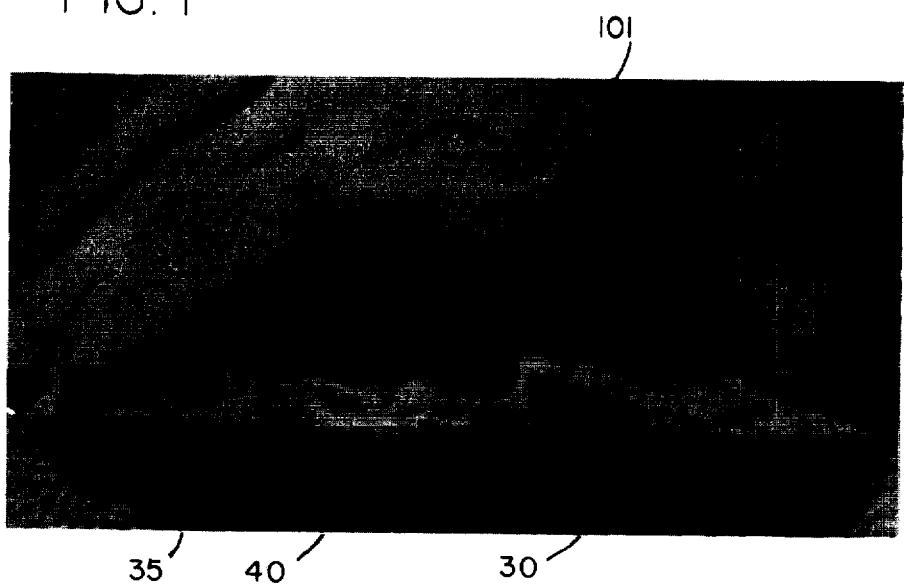
FIG. 1 is an enlarged photographic side view taken horizontally along the direction of arrow 1A of FIG. 4 of an array of electrical components on a circuit board with a tie down fabric made according to one embodiment of process of this invention holding and positioning said components on the board; this view illustrates fine detail of the interlaced fabric structure. The hand 101 of the operator 102 illustrates the size of the overall fabric and board and component structures.
Figure 2:
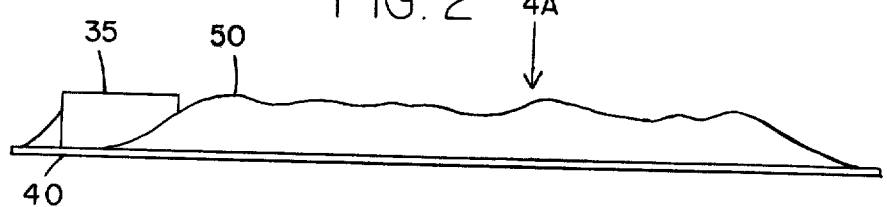
FIG. 2 is a diagrammatic overall side view of the apparatus shown in FIG. 1.

In a first stage of operating according to this invention a first fluid composition 29 comprising a solvent with a resin suspended or dissolved therein is sprayed toward and applied to an array as 30 of discrete electronic components as resistors 31, 32 131 and capacitors 33, 34 integrated circuits as 35 and 36 packaged circuits and transistors as 38 on a printed circuit board 40. The board 40 comprises a rigid nonconductive mass 41 between an upper surface 42 and a lower surface 43. Conductors as 44, 45, 46 and 144, 145 and 146 are printed on the lower and upper surface in a conductive patterns 60 and 66 holes as 47, 48, 49 extend through the mass 41. Each of the electrical components as 31, 33, and 35 has firmly connected thereto rigid external leads as leads, 71 and 72 for resistor 31, leads 73 and 74 for capacitor 33, leads 75 and 76 for integrated circuits 35 which project through holes as 47 in the circuit board from the upper to the lower surface for subsequent connection to the patterns 60 and/or 66. The components and leads extend perpendicularly from the upper surface 42 of the circuit board 40 as shown in the FIGS. 1–10 and 12–17.

Figure 3:
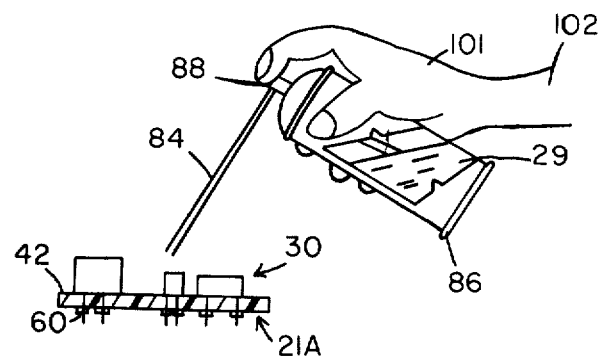
FIGS. 3, 5, 7, 9 and 11 diagrammatically respectively show sequential steps in a sequence of steps according to one embodiment of process of operation according to this invention.
Figure 4:
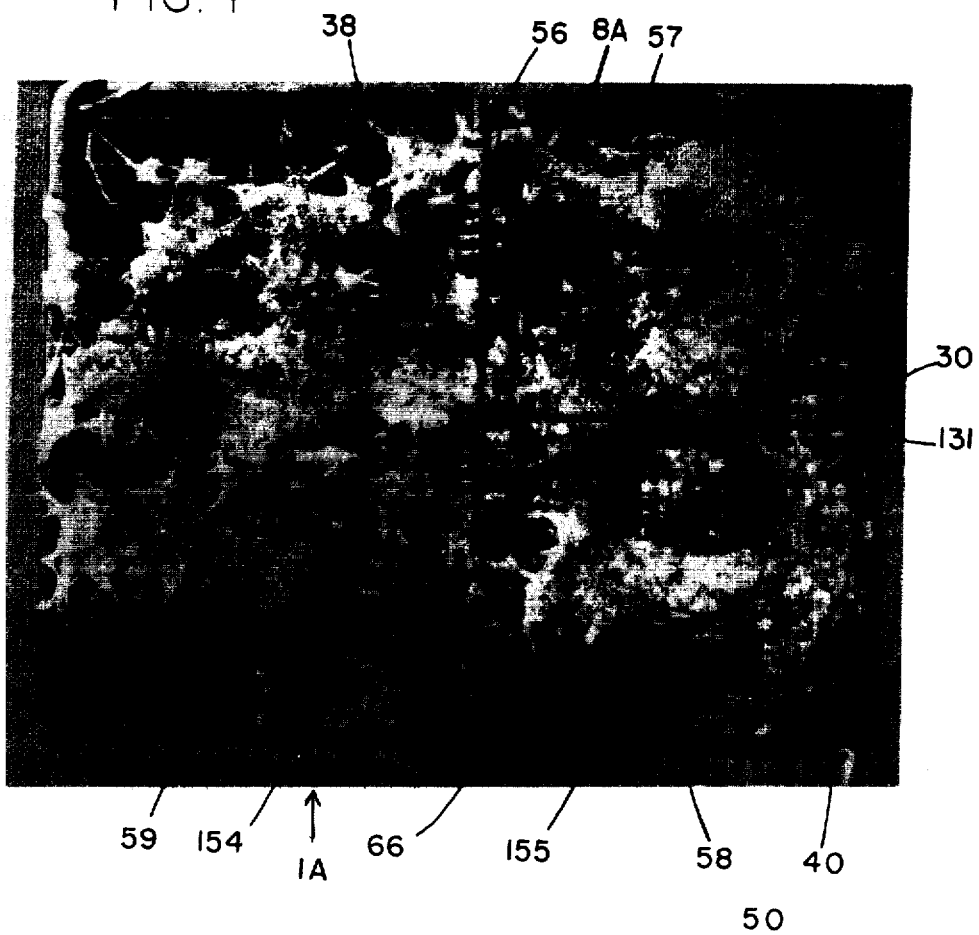
FIG. 4 is a photographic top or plan view taken vertically downwardly along the direction of arrow 4A of FIG. 2, of the array of electrical components on a circuit board with a tie down fabric made according to one embodiment of process of this invention holding and positioning said components on the board; this view illustrates overall relations of the interlaced fabric structure. This view shows the serial connection of portions of the fabric from near one corner of a group of components on the circuit board to a diagonally opposite corner thereof.
Figure 5:
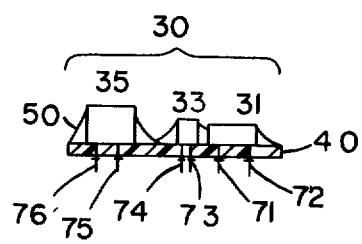
Figure 6:
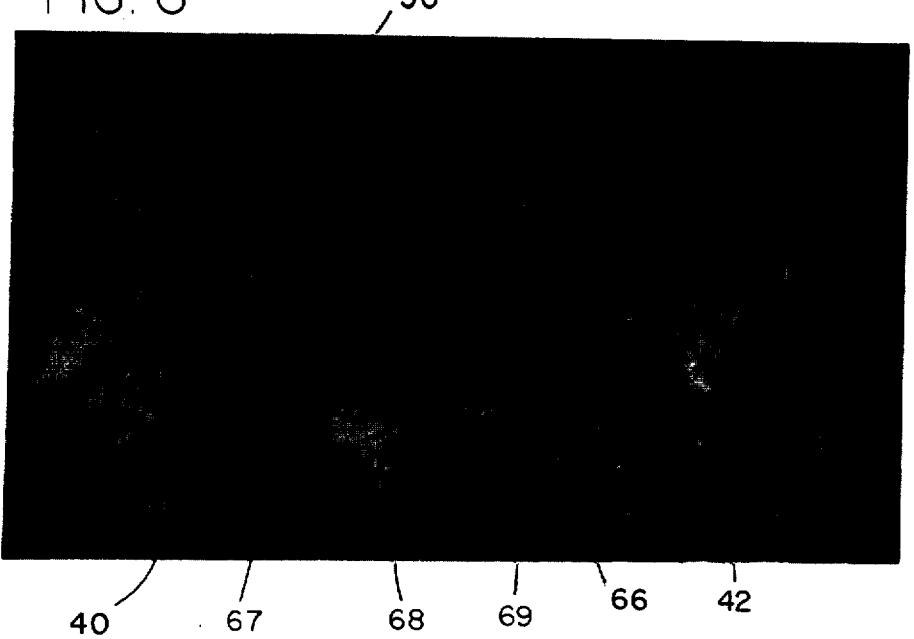
FIG. 6 is a top oblique photographic view taken obliquely downwardly along the direction shown by arrow 1A in FIG. 4, of the array of electrical components on a printed circuit board with the network fabric holding and positioning said components on the board. This view shows to scale the vertical and horizontal connections and positions of parts of the coarse fabric net to vertically extending portions of the electrical components and portions of the circuit board surface horizontally spaced from such electrical components.

The first liquid composition 29 comprises a solvent which volatalizes at 70 degrees F. (deg. C). The therein dissolved resin is one which is a solid at usual room temperatures (60 deg. F. to 110 deg. F.). Such liquid applied as shown in FIG. 3 to project the solution or suspension against the array 30 and deposit the resin of the solution in form of a mechanically stable foramenous web-like hold down or tie down fabric 50 as shown in FIGS. 1, 2, 4, 6, 8, and 10. Such web-like hold down fabric is formed of solid cord-like members as 51, 52, and 53 and 151, 152 and 153 arrayed in the form of a network as 50 with web spaces as 54, 55, 56 between and adjacent the adjacent rope-like members such as 51, 52, 53, 151, and 152. The rope-like members of the web are joined to each other at junctions as 57, 58, 59 and portions of the web firmly join and adhere to the surface of the printed circuit board at connections as 61, 62, 63 of cord and board surface. The web fabric 50 extends over the upper portions of each of the plurality of components of the array 30 and adheres thereto and holds those components to the board although those components are otherwise moveable relative to the board.

Figure 7:
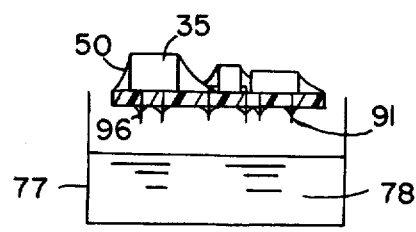
Figure 8:
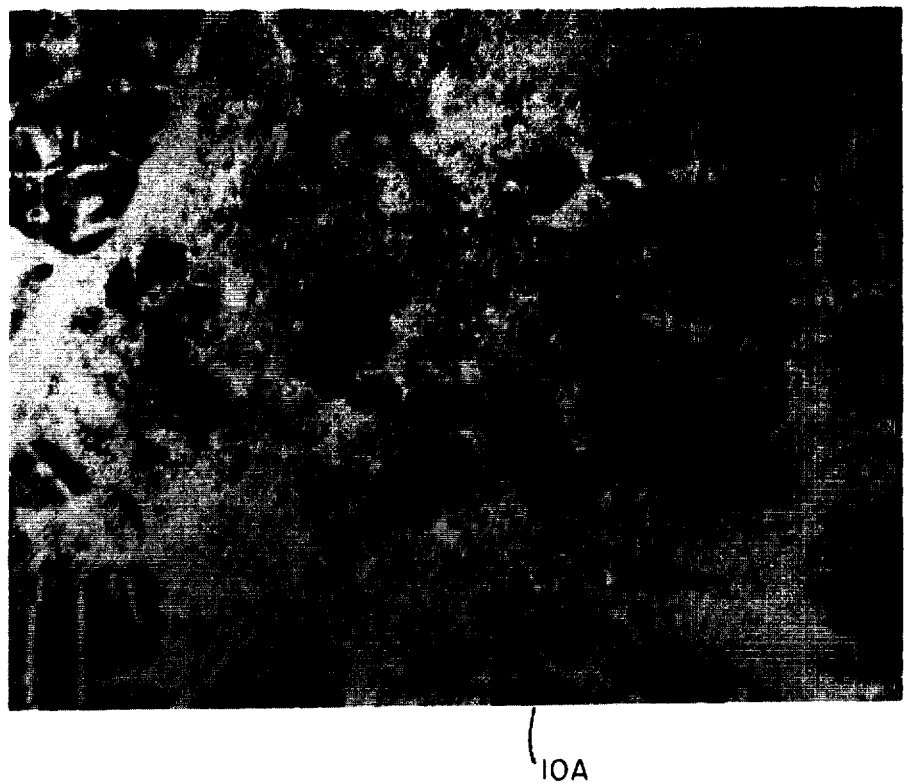
FIG. 8 is an enlarged photographic view taken showing microstructure and detailed fabric structures in zone 8A of FIG. 4.

In a second phase of the operation according to this invention as shown in FIG. 7 while such components of the array are held to the circuit board the circuit board is located over a wave former 77. The wave former is a source of hot solder 78 the vapors of which contact the projecting ends as 91–96 respectively of the external leads as 71–76 of the discrete components and deposit solder 100 at the junction of the conductive components as 44–46 of such circuit board with the projecting leads or connectors as 71–76 of the discrete components and thereby electrically and mechanically connect those discrete components to the conductive components of the circuit board.

Figure 9:
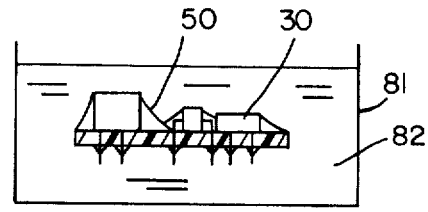

Following such electrical and mechanical soldering connection of the discrete components to the conductive pattern components of the circuit board the network fabric 50 is removed from the circuit board in a fourth stage of operation, shown in FIG. 9 by immersing the totality of circuit board, discrete components connected thereto, and network fabric in a body of liquor or fluid 82 which dissolves the network and such resulting solution or suspension, with the network components carried therein is removed from the combination of circuit board and discrete component connected thereto. Such operation results in a complete removal of the network fabric 50 from the circuit board 40 and from each of the array 30 of electrical components.

Figure 11:
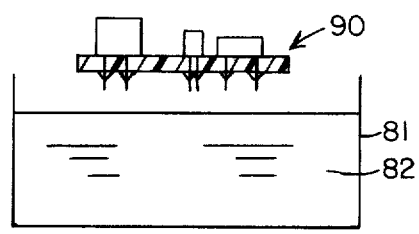
Figure 12:
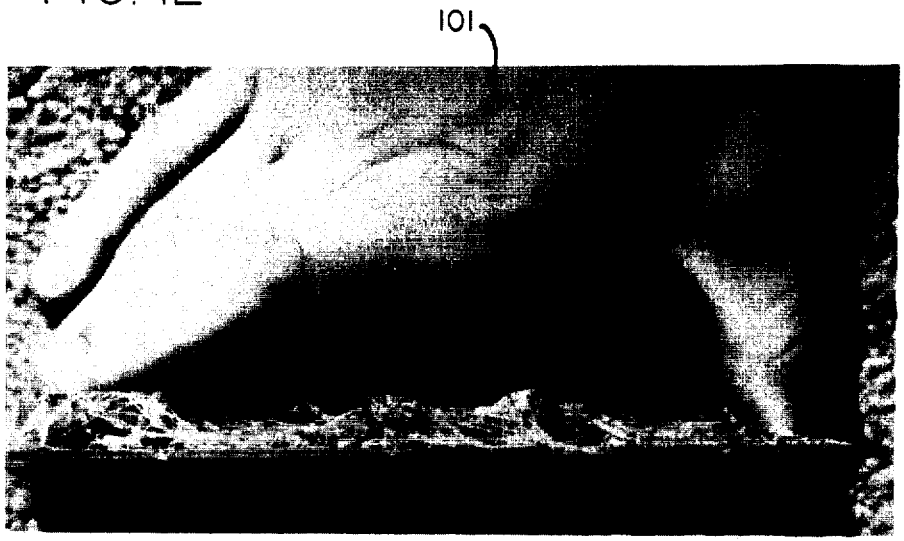
FIG. 12 is an enlarged photographic side view taken along the direction of arrow 12A of FIG. 14 of an array of electrical components on a circuit board with a tie down fabric made according to a second embodiment of process of this invention holding and positioning said components on the board; this view illustrates fine detail of the interlaced fabric structure. The hand of the operator illustrates the size of the overall fabric and board and component structures.
Figure 13:
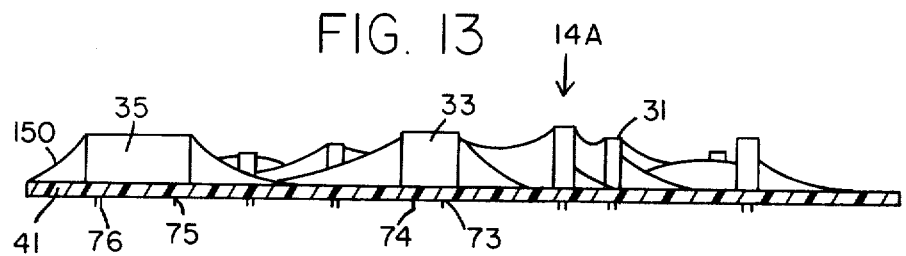
FIG. 13 is a diagrammatic vertical longitudinal section as along the plane shown as 13A—13A in FIG. 14 of the apparatus shown in FIGS. 12, 14, 16 and 18.
Figure 14:
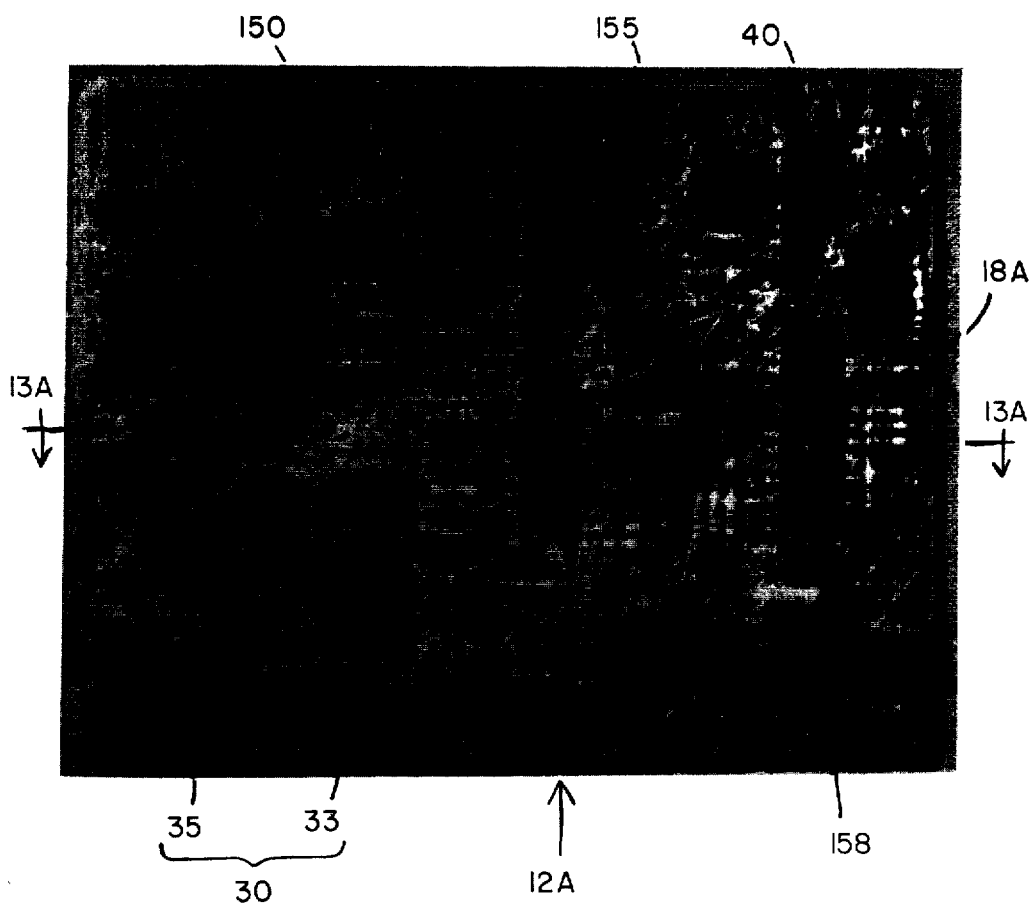
FIG. 14 is a photographic top or plan view taken along the direction of arrow 14A of FIG. 13 of the array of electrical components on a circuit board with a tie down fabric made according to a second embodiment or process of this invention holding and positioning said components on the board; this view illustrates overall relations of the interlaced fabric structure. This view shows the serial connection of portions of the fabric from near one corner of a group of components on the circuit board to a diagonally opposite corner thereof.

In a fifth stage of operation the mechanically and electrically connected assembly 90 of components and printed circuit board is removed from the fluid 82 as shown in FIG. 11.

In the first stage of operation the suspension or solution 29 of solvent and resin is dispensed from a container therefor 83 in the form of a conical stream 84. The liquor 29 is, in one embodiment of the invention initially held in a standard aerosol or spray can dispenser 83 at superatmospheric pressure by a propellant gas as FREON 12 which is chemically inert relative to each of the separate components of liquid 29 and to the totality of components in liquid 29. The liquid 29 propelled from its source 83 by compressed gas 85 in the can 83 which moves the solution 29 in the form of such stream generally outlined by a conical surface 87 of which the thickness is determined by the size of the nozzle 88 used on the can or container 83 such conical surface is directed toward the array 30 and component carrying circuit board 40. The initially thin stream initially emanating from the beginning thereof, as a spray head 88 becomes foramenous very shortly after its emanation from the spray head due to the volatility of the solvent for the resin, whereby the resin reaches the component carrying circuit board in the form of a thin foramenous mass. The material initially composing the foramenous stream has a sufficiently low viscosity and a sufficiently low surface tension that the material within the stream does not form into balls but rather undergoes a rapid transformation from a continuous homogeneous stream extending over a small predetermined transverse area of the nozzle 88 (about 0.03 to 0.05 mm. diameter) to a thin wide foramenous mass extending over an area of 4 to 25 square inches. The holes developed in the foramenous stream expand rapidly for 10 seconds and the material in the stream rapidly develops an increased surface tension as the cross section of the stream expands and travels away from the source, such as a spray head 88. The chemical composition of the stream thus determines the thickness of rope-like fibers as 51–53 forming the resulting fabric net or network 50. The fibers or cords as 51, 52, 53 which are composed of the solidified resin dry rapidly, normally within two to four seconds from time of issuance from the spray head, with most of the drying occurring within the first second, during the period of travel of the initial suspension 29 toward the array 30 on circuit board 40.

Figure 19:
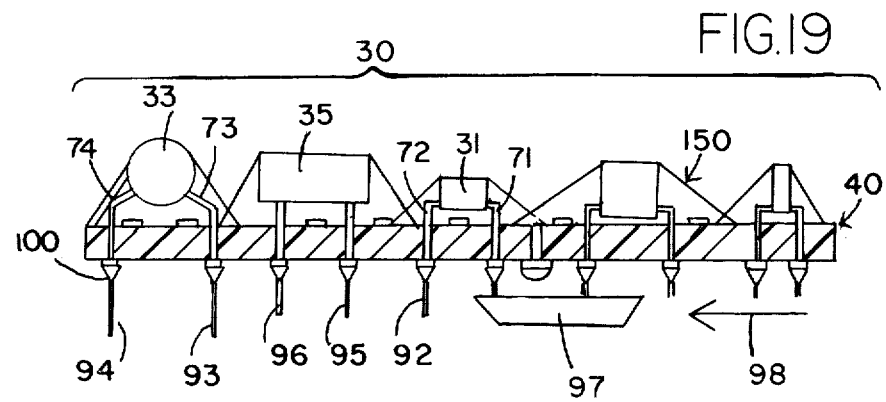
FIG. 19 diagrammatically shows a stage in the sequence of operation wherein the terminal portions of external leads of the components on the circuit board are cut off. This view is a diagrammatic vertical cross section view of a circuit board generally as shown in FIGS. 3, 5, 7, 9, and 11 but to a larger scale.
Figure 20:
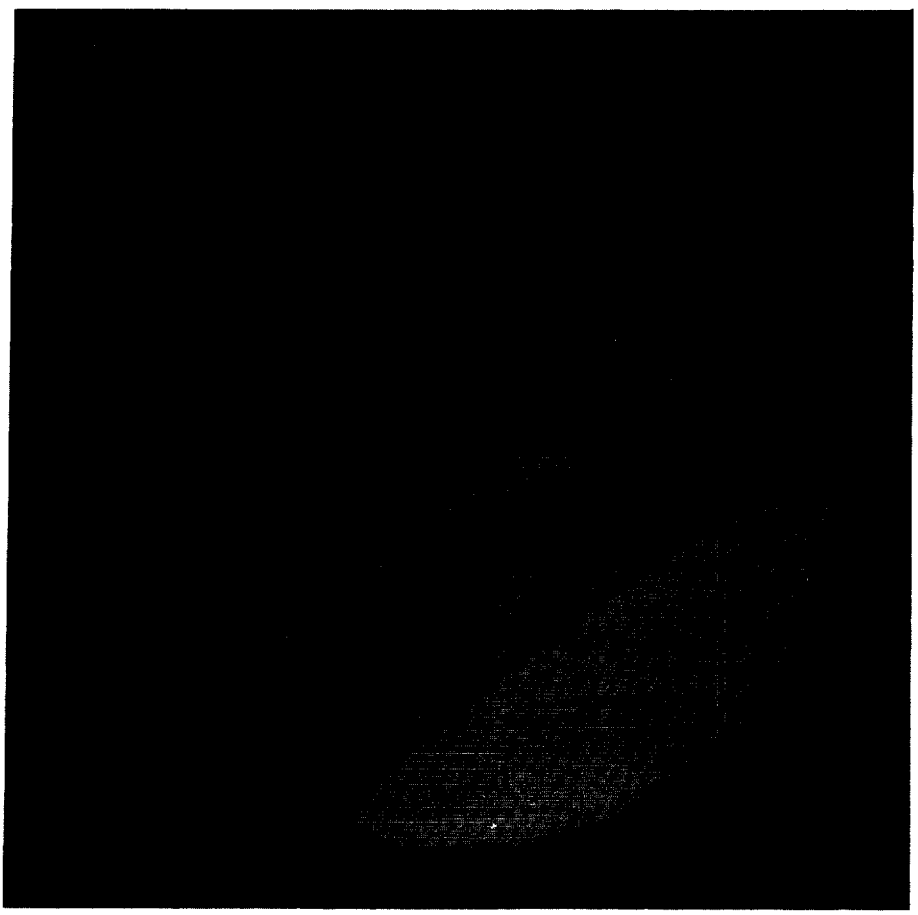
FIG. 20 is a microscopic view of fibers of the fine fabric net as in zone 20A of FIG. 18 with scale inserted.
Figure 21:
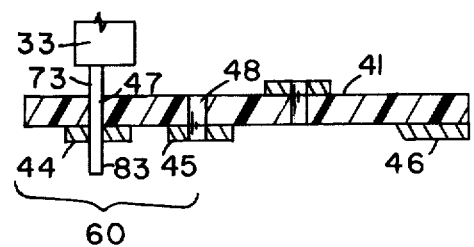
FIGS. 21, 23, 24, 25 and 26 diagrammatically respectively show sequential steps in a sequence of steps in the operation of placing a masking agent on selected portions of the conductive pattern of a circuit board.
Figure 22:
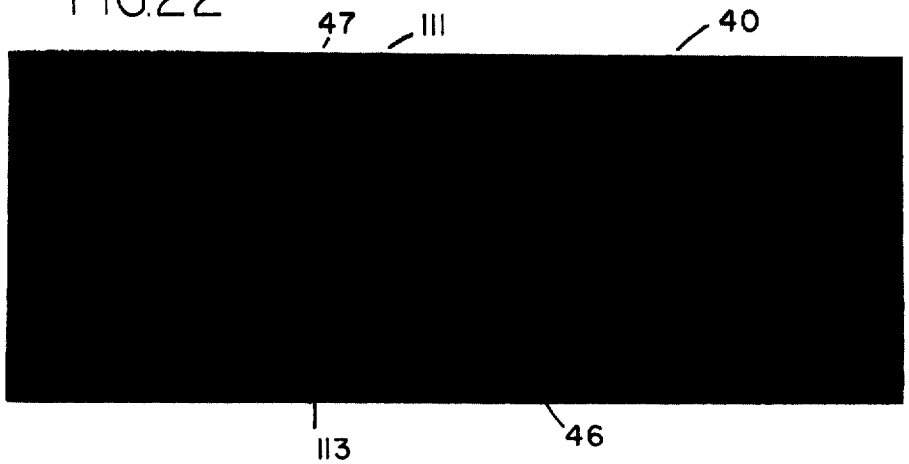
FIG. 22 is a oblique view of a circuit board taken along the direction of the arrow 22A of FIG. 24 to show the microstructure of a portion of one surface of a circuit board when masking agent has been applied thereto as in FIG. 24.
Figure 23:
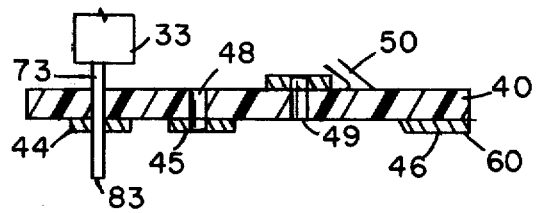

The thin circuit board is rigid and has a composition which is substantially the same from the outer surfaces 42 and 43 to the interior thereof. The initial solvent volatility and resin therein are of such composition as to solidify and adhere the resin to the circuit board to form a fabric as 50 with sufficient strength to hold the discrete components to that circuit board during the soldering operation connecting the external component leads to the conductive pattern of the circuit board as shown in FIG. 7, and subsequent removal of terminal portions of the external leads as shown in FIG. 19 in a firm and reliable manner and permit handling of the assembled circuit board. Such firm holding of the component is accomplished because the fibers of which the network fabric 50 are formed are sufficiently thin to project from the top of the components on the circuit board to the surface 42 of the circuit board and hold down each of the components to the circuit board while the leads or prongs from each of such components is located in orifices therefor as 47 and 48 in the circuit board. The dried network fabric 50 firmly holds all of the plurality of closely spaced components of the array 30 in place on the circuit board and in relation to each other while, in a third stage of operation, as shown in FIG. 7, the leads of the components of can are soldered in a conventional wave forming machine 77 for incorporation of the circuit components into an operative electrical circuit.

After the discrete components are soldered or otherwise mechanically and electrically connected to the conductors on the circuit board to complete the electrical circuit assembly and unwanted terminal portion of leads removed, the entire assembly 90 comprising board, and electrical components and fabric 50 is immersed in a solvent 82 (in the degreaser tank or apparatus 31. That solution or solvent 82 dissolves the network fabric 50 selectively but does not affect the high electrical resistance characteristics of the circuit board nor of the individual discrete components and leaves the connected assembled circuit without any residue of the network fibers or of the solvent which initially suspended the resin material from which the holding network 50 was made.

Figure 10:
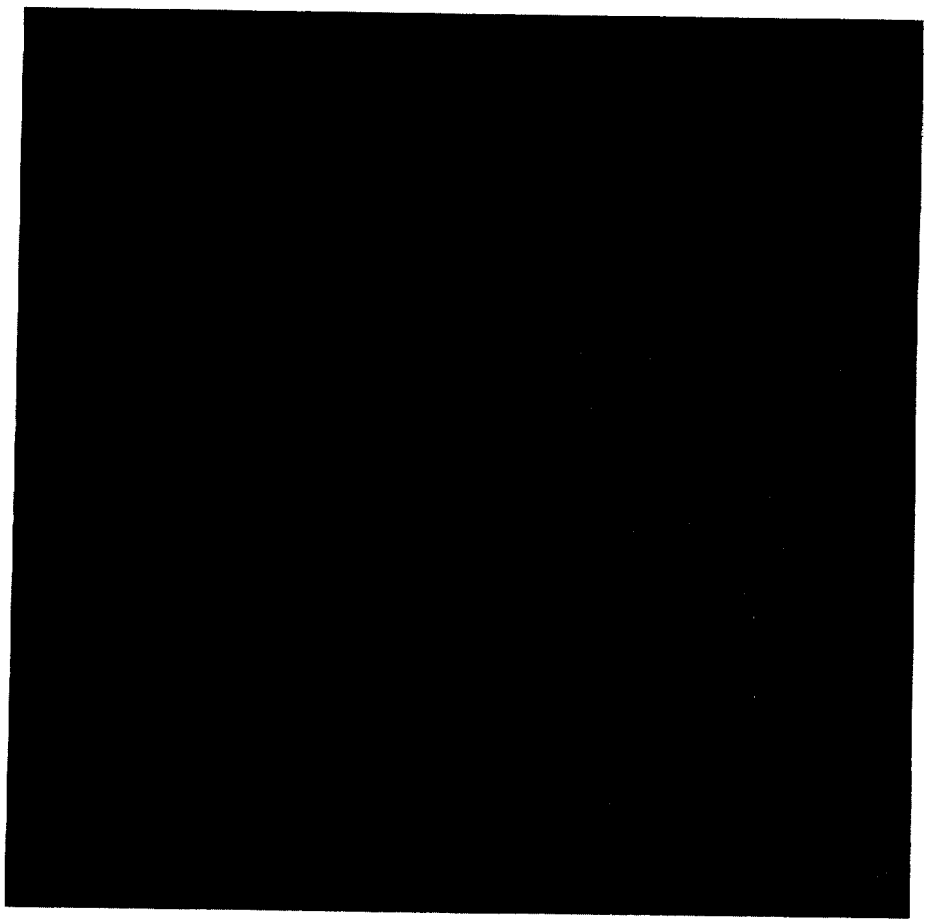
FIG. 10 is a microscopic view of a fiber of the fabric net as in zone 10A of FIG. 8, with scale inserted.

In the particular operation shown in FIG. 3 according to this invention the initial stream of solution plus resin is produced from a spray nozzle 88 which spray nozzle is a part of a dispensing can 86, the can having an interior volume within which a solution of solvent and resin dissolved therein is located together with a predetermined amount of fluorocarbon propellant such as FREON 12. FREON 12 is a registered trademark of E. I. DuPont de Nemours of Wilmington Delaware. It has a chemical formula of $CCl_2F_2$, a molecular weight of 120.93 and a boiling point of −29.8 degrees C. (−21.6 degrees F.). The solution 29 is composed of isopropyl alcohol as solvent, and acrylic resin as a solute. The alcohol is generally heated to 115 degrees F. and agitated with the resin to dissolve the resin therein, following which the solution is cooled to 70 degrees F. added to the can and then FREON is added to the can and the cap attached thereto. The solution contains 25% by weight of resin and 75% by weight of isopropyl alcohol, the alcohol having a boiling point of −21.6 degrees F. This initial amount of isopropyl alcohol may vary by plus or minus 5 percent. The volume of solution in a can as 86 may vary from 50% to 65% of its volume with the remainder taken up by FREON 12 and the FREON 12 may in turn vary from 50% of volume to 35% by volume at a pressure of about 12 to 15 p.s.i.g. The fibers forming the rope-like components of the network utilizing such spray can are relatively porous as shown in FIG. 10 and the diameter of such fibers ranges from 0.3 to 0.7 mm diameter.

Figure 17:
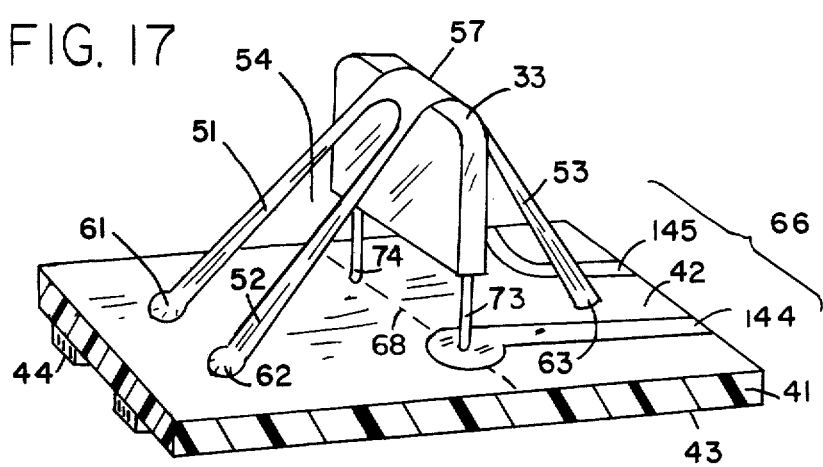
FIG. 17 is a diagrammatic showing of relations of geometrical features of one electrical component in the array of positioned electrical components on the circuit board in the position of parts of such components shown in FIGS. 1, 4, 6, 8, 12, 14, 16 and 18.
Figure 18:
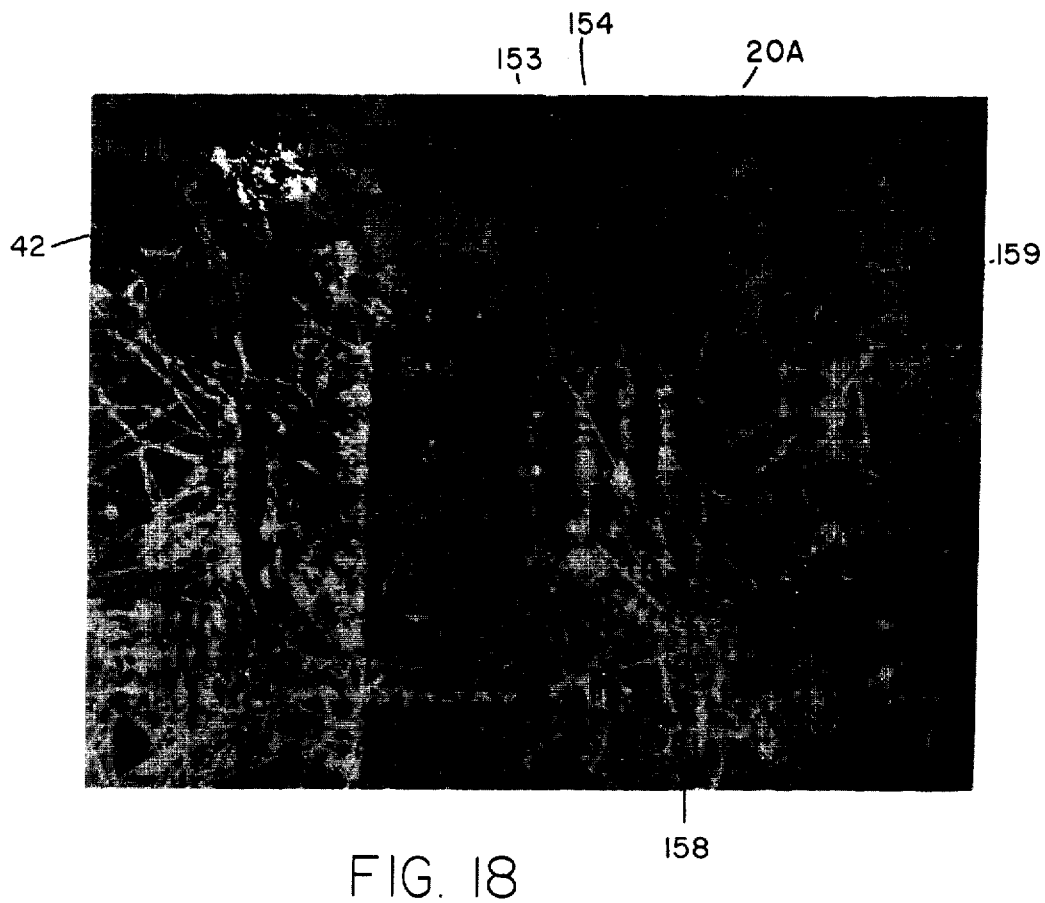
FIG. 18 is an enlarged photographic view taken showing microstructure and detailed fabric structures in zone 18A of FIG. 16.

The spaces as 54, 55, 153, 154 and 155 between the fibers of the fabric are sufficiently small that the electrical components as 33 are each individually held by porous of such fabric, as shown in FIGS. 4, 6, 8, 14, 16, 17 and 18. Additionally the fibers as 51 and 151 extend from the tops of components as 33 at acute angles of 20 degrees to 60 degrees to the length of the electrical components as 33 and at angle of 30 degrees to 60 degrees to the surface as 42 of the circuit board as 40 into and through which the external leads as 73 and 74 of such components as 33, as shown in FIG. 17 extend, so that such fabric elements as 51, 52 and 53 as is shown in FIG. 17 provide for stabilizing all those elements of array 30 about an axis as 68 in FIG. 17 formed by the line of intersection of the component external leads as 73 and 74 and the surface 42 of the circuit board 40 to which board such components are attached by such leads. Such angular relationship of fibers to the surface having tensile strength provides for maintaining the position and orientation of such components as well as holding each such component as 33 towards the surface 42 of the board 40 during the manipulation of the board and soldering of its external leads as 73 and 74 to portions as 44 of the electrically conductive pattern as 60 on the bottom surface 43 and/or pattern 66 on the top surface of such circuit board. The fabric 50 and 150 also serve to maintain the position of parts that may be dislodged during the operation of cutting off undesirably long terminal portions, as 91-96 of external leads.

FIG. 19 shows stages in a sequence of operation of removal of the unwanted length of external leads as 92-96 projecting through the circuit board 40, such step being performed by a cutting blade 97 moving in direction 98 while the network fabric 50 is still attached to the array 30 and circuit board 40. The serial connection of each of the fibers, as 51 and 151 of the fabrics 50 and 150 to other portions of the fabric on the board as 40 serves to rigidify the positioning of other positioned by but not firmly held electrical components, the external leads as 73 of which are located in holes therefor in the circuit board as the fabric 50 acts as a tie down or hold down as well as a positioning and guying element for those components.

The fabric 50 and 150 define surfaces which have portions of which the radius of curvature is less than the longest dimensions of the length of the components held on the board. Mechanical removal of a rigid continuous surface would disrupt the connection of the external leads of the components with the conductive portions of the patterns of the circuit board to which such external leads may connect. The average thickness of the fabric 50 and 150 provided herewith is extremely small, only about 0.003 mm and 0.0005 mm respectively, and such finess is the result not only of the small diameter 0.05 mm and 0.025 mm of fibers as 51 and 151 of which the net or mesh of which the fabric 50 and 150 is formed but, also, because of the dilution of even such small diameter of fibers by the dimensions of the spaces as 57 and 157 between such fibers. The small diameter 0.05 and 0.025 mm of the fibers as 51 and 152 provides a large surface per unit mass ratio which ratio enhances the dissolving of such solid fibers in the solution 82 used to dissolve such fibers in the fourth phase of operation of the process. Nevertheless the dimensions of such fibers as 51 and 151 are adequate in view of the strength of such fibers for the purpose of positioning and tieing down the electrical components as 31-36 of the array as 30 to the circuit board surface during wave soldering manipulation and lead cutting.

Butyl methacrylic polymer sold as Elvacite 2045 by DuPont Co. of Wilmington, Delaware is the solute in solution 29. It is chemically inert having an acid number of 0 (milligrams potassium hydroxide absorbed per gram of polymer) but when dry has a tensile strength of 3,600 p.s.i. and a Tukon hardness of 8 measured at 23 degrees C. (73 degrees F.) and 50% R.H. on Tukon tester at 25 g. load using a 1.6 mm (1/16 in.) thick disc prepared by compression molding bead polymer. As a measure of molecular weight the solute has an inherent viscosity measured in a solution of 0.25 g polymer in 50 ml. methylene chloride measured at 20 degrees C. using a Cannon-Fenske viscometer.

The polymer is adherent to the fiberglass resin of which the circuit board surface is composed but is dissolved readily in the solvent for the first solution which solvent, as isopropyl alcohol, isoamyl alcohol and cyclohexanol, have no action or residue effect on the circuit board. The butyl methacrylate solute used in solution 29 has a solubility of over 40% by weight; at 20% by weight solid in isopropyl alcohol it has a Gardner Hoidt viscosity at 25 degrees C. value of W (6.27 stokes at 30% by weight it has a Gardner Hoidt viscosity value of Z4 (36.2 stokes). At 40% solid by weight the solution has a viscosity, measured in Stokes of over 1066, and above Z10 as measured by Gardner Hoidt.

Figure 24:
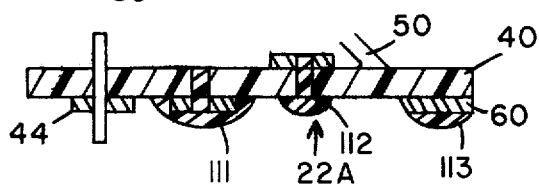
Figure 25:
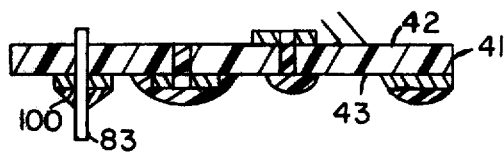
Figure 26:
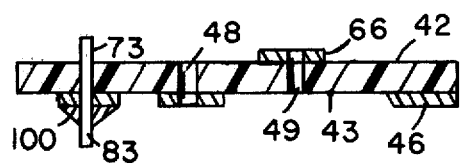

Also within the scope of this invention is the use of a masking agent liquid 110. Liquid 110 is composed of resin solute and solvent as 29 but dabbed on as in FIGS. 19-24 and 25 in the sequence of FIGS. 21, 23, 24, 25, 26. Such liquid 110 is applied to those holes as 48 and 49 and terminals as 46 in a circuit board as 40 which are desired to be kept empty or open during a subsequent soldering operation as in a wave form machine. For this purpose the agent 110 is applied to the holes as 48 and 49 as shown in FIG. 24 and deposits a mass of resin as 111 and 112 to block those holes and deposit a mass of resin as 113 to cover a terminal as 46. Such operation would preferably follow forming a tie down fabric as 50 as shown in FIG. 24 and above described and precedes soldering as shown in FIG. 7. After soldering of the leads, as 73 of components as 33 to the conductive pattern portions as 44 of the circuit board as in FIG. 7 to form a completed circuit board as 90 with electrical circuits therein to the discrete electrical components to form a structure as in FIG. 25, the immersion of the completed assembly of circuit board and discrete components and network and masking agent as in FIG. 9 provides for complete removal not only of fabric 50 but also of the masking agent deposits, as 111 and 112 and 113 from the blocked holes as 48 and 49 and terminals as 46 so that such holes and terminals are available as shown in FIG. 26 for subsequent connection to components.

The cleansing of the network from the circuit board combination with discrete components connected thereto as shown in phase 5 in FIG. 11 may be accomplished by a vapor phase degreasing as well as by immersion in liquid and the cleaning out of the holes which contain masking agent may also be accomplished by vapor phase degreasing in combination with ultrasonics.

The vapor degreaser is a conventional vapor degreaser as made by Branson Manufacturing Co. of Shelton, Connecticut and described in their brochure S-960A. The second solution or solvent 82 used therein is composed of 5.7% methanol 94.5% trichlorotrifluoroethane, and 0.25% nitromethane and its temperature is maintained at 103.5 degrees F. The assembly 90 is exposed to such fluid for from 4 to 6 minutes.

Other solvents, as 95.2% trichlorotrifluoroethane 3.8% ethanol and 1% nitromethane may be used as solution 82 at different temperatures e.g. 95 degrees F. to 115 degrees F.

The orifice of spray head 88 is 0.012 inch (0.3 mm) diameter. The orifice in spray 88 gun head of spray gun the orifice is adjustable up to 0.5 mm. The network fabric 50, like 50 is mechanically stable during (a) application of solder to the circuit board (as shown in FIG. 7) even though the temperature of the solder is usually 500 degrees F. and (b) the preheat temperatures usually of 150-200 degrees F. applied to circuit board as 40, fabric as 50 and 150 and array 30 prior to application of solder thereto as shown in FIG. 7.

Figure 15:
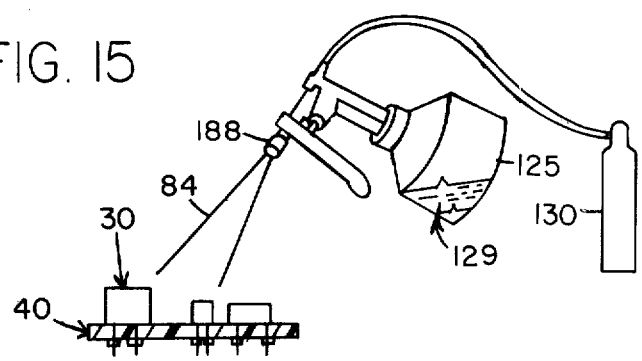
FIG. 15 diagrammatically illustrates a first stage in the operation of a process according to this invention in which stage a solution of fabric forming material is applied at high pressure drop through a nozzle onto a positioned array of components on a printed circuit board in the first of several steps in a sequence of steps according to a second embodiment of process of operation according to this invention.
Figure 16:
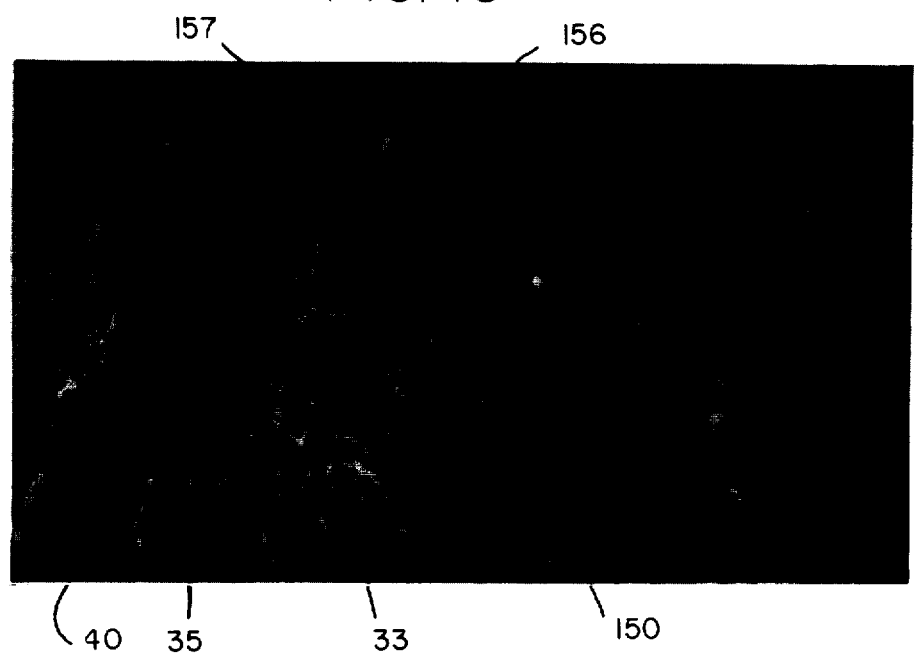
FIG. 16 is top oblique photographic view, taken obliquely along the direction shown by arrow 16A in FIG. 14 of the array of electrical components on a printed circuit board with the network fabric holding and positioning said components on the board. This view shows to scale the vertical and horizontal connections and positions of parts of the fine fabric net to vertically extending portions of the electrical components and to portions of the circuit board surface horizontally spaced from such electrical components.

In another embodiment of apparatus and process according to this invention an air gun 125 as de Vilbis MBC-50-15 operating at 40 to 50 p.s.i.g. supply pressure at gas tank 130 with a pressure across the air gun of 12 to 15 p.s.i. is applied to a liquid 129 of same composition as 29. Such liquid 129 is applied as shown in FIG. 15 to project the solution or suspension against the array 30 and deposit the resin of the solution in form of a mechanically stable foramenous web-like hold down or tie down fabric 150 as shown in FIGS. 12, 14, 16, 18 and 20. Such web-like hold down fabric is formed of solid cord-like members as 251, 252 and 253 arrayed in the form of a network as 150 with web spaces as 154, 155, 156 between and adjacent the adjacent rope-like members such as 251, 252, 253. The rope-like members of the web are joined to each other at junctions as 157, 158, 159 and portions of the web firmly join and adhere to the surface of the printed circuit board (as at connections 61, 62, 63 of cord and board surface). The web fabric 150 extends over the upper portions of each of the plurality of components of the array 30 and adheres thereto and holds those components to the board although those components are otherwise moveable relative to the board.

In a following phase of the operation according to this invention as shown in FIG. 7 while such components of the array 30 are held to the circuit board the circuit board is located over a wave former 77 and the projecting leads of the discrete components are then soldered to thereby electrically and mechanically connect those discrete components to the conductive components of the circuit board.

Following such electrical and mechanical soldering connection of the discrete components of the conductive pattern components of the circuit board the network fabric 150 is removed from the circuit board and placed in degreaser 81 in a fourth stage of operation as shown in FIG. 9. Such operation results in a complete removal of the network fabric 50 from the circuit board 40 and from each of the array 30 of electrical components.

In a fifth stage of operation the mechanically and electrically connected assembly 90 of components and printed circuit board is removed from the fluid 82 as shown in FIG. 11.

The fabrics 50 and 150 are composed of junction portions of relatively low porosity as 57, 58 and 59 in fabric 50, and 154, 155 and 156 in fabric 150. The low porosity portions are connected to the portions of the electrical components remote from the surface, as 42, of the board 40 while the high porosity portions (formed of thin fibers) as 67, 68 and 69 in fabric 50, and portions 157, 158, 159 in fabric 150 comprise fibers which are connected directly to the printed circuit board surface, as 42.

The very large ratio of surface to mass provided by the small diameter fibers, as 51 and 151, adjacent to the circuit board provides for rapid solution of the fabrics 50 and 150 when exposed to the solvent, 82, therefor while those fibers are adequately strong and have adequate tensile strength notwithstanding their small diameter to hold each of the components of array 30 to the circuit board during manipulation, soldering and, later, cutting. The amount of solvent in solution 29 is adequate to provide the fluidity or low viscosity stream to provide for the thin or small diameter characteristic of the fibers, as 51, 52, 53 from which the fabric 50 is formed rather than forming heavy thicker fibers. However, the concentration of the liquid is sufficiently high so that fibers forming the network will be formed during the period of time in which the solution is travelling from the head of the spray source toward the loosely held combination of electrical components and circuit board 40.

Circuit board 40 is 5½ inches long and 4¼ inches wide and 1/16 inch thick, and made of electrically non-conductive material.

We claim:

1. An electronic assembly process comprising a first stage wherein a solution of fabric forming material is formed and applied to a positioned array of electrical components on a printed circuit board, a second stage in which a component holding and positioning fabric is attached to said positioned array of electrical components on said printed circuit board, a third stage in which an array of external leads of said electrical components held by said fabric to said printed circuit board are soldered to portions of patterns of conductive elements on the surfaces of that printed circuit board, a fourth stage in which the assembly of component holding and positioning fabric and electrically connected components and printed circuit board is located in a body of fluid to dissolve said fabric, and a fifth stage in which stage the connected assembly of electric components and circuit board free of said fabric is removed from said fluid.

2. Process as in claim 1 wherein said fluid is without action on said circuit board.

3. Process as in claim 2 wherein external leads of said electrical components project through said circuit board and are cut off while the component holding and positioning fabric is attached to said array of components and to said circuit board.

4. Process of assembling electrical components in an electrical circuit as in claim 1, further comprising the steps of placing a masking agent on selected portions of the conductive pattern of a circuit board on which electrical components are located applying solder to the leads of said electrical components and to portions of a conductive pattern on said circuit board except for where such patterns are blocked by the masking agent immersing the resulting circuit board and components in a solvent and removing said masking agent from that assembly of circuit board and electrical components.

5. An assembly product comprising a printed circuit board comprising a rigid nonconductive mass between an upper surface and a lower surface, electrical conductors on said lower and upper surface in conductive pattern, holes extending through said mass, a plurality of electrical components, each having firmly connected thereto rigid external leads which project through holes in said circuit boards from connections to said patterns, and a mechanically stable foramenous fabric formed of fiber members arrayed in the form of a network web with spaces between and adjacent the neighboring fiber members, said fiber members of the web joined to each other at junctions and portions of the web firmly joined and adhering to the surface of the printed circuit board, said fabric extending over the upper portions of each of the plurality of components of the array and adhering thereto and holding those components to the board.

6. Apparatus as in claim 5 wherein said fibers have a diameter in the range of 0.025 to 0.075 mm.

7. Apparatus as in claim 6 wherein said fibers are formed of organic resin soluble in liquids inert to said circuit board.

8. Apparatus as in claim 7 wherein said fabric is formed of acrylic resin.

9. Apparatus as in claim 8 wherein said fabric is formed of butyl methacrylate.

* * * * *